(12) United States Patent
Murray

(10) Patent No.: US 6,349,055 B1
(45) Date of Patent: Feb. 19, 2002

(54) NON-VOLATILE INVERTER LATCH

(75) Inventor: Kenelm G. D. Murray, Sunnyvale, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/706,984

(22) Filed: Nov. 6, 2000

Related U.S. Application Data

(63) Continuation of application No. 09/456,801, filed on Dec. 8, 1999, now Pat. No. 6,144,580.
(60) Provisional application No. 60/111,822, filed on Dec. 11, 1998.

(51) Int. Cl.[7] .............................................. G11C 16/04
(52) U.S. Cl. ............................ 365/185.01; 365/185.07; 365/185.18
(58) Field of Search ....................... 365/185.01, 185.18, 365/185.27, 185.29, 185.07, 154

(56) References Cited

U.S. PATENT DOCUMENTS

| | | | | | |
|---|---|---|---|---|---|
| 4,132,904 A | * | 1/1979 | Harari | ......................... | 365/154 |
| 4,342,101 A | * | 7/1982 | Edwards | ...................... | 365/154 |
| 4,596,938 A | * | 6/1986 | Cartwright, Jr. | ........ | 365/185.18 |
| 4,829,203 A | | 5/1989 | Ashmore, Jr. | ............... | 307/469 |
| 4,885,719 A | | 12/1989 | Brahmbhatt | ................. | 365/181 |
| 5,311,470 A | * | 5/1994 | Atsumi et al. | .............. | 365/154 |
| 5,587,603 A | | 12/1996 | Kowshik | ..................... | 257/316 |
| 5,740,106 A | | 4/1998 | Nazarian | .................. | 365/185.1 |
| 5,764,096 A | | 6/1998 | Lipp et al. | ................... | 327/434 |
| 5,857,993 A | | 12/1998 | Dejenfelt | ................. | 365/185.1 |

* cited by examiner

*Primary Examiner*—Son T. Dinh
(74) *Attorney, Agent, or Firm*—Christopher R. Malorana, P.C.

(57) ABSTRACT

A non-volatile memory cell comprising a first transistor and a second transistor. The first transistor may be configured to receive an input and a first voltage. The second transistor may be configured to receive said input and a second voltage. The first and second transistors are generally coupled to an output.

19 Claims, 3 Drawing Sheets

ERASE

SELECTED

SEL (same word)

SECOND ALTERNATIVE EMBODIMENT
DESELECTED

SECTOR ERASE
DESELECTED

DESELECTED

WORD/BIT ERASE
DESELECTED

PROGRAM

SELECTED

DESEL (same word)

READ BIASSING (WHOLE ARRAY)

DESELECTED WORD

DESELECTED WORD

TEST REQUIREMENTS:
(First alternative embodiment as in Fig.2)

ERASE

SELECTED

SEL (same word)

THIRD ALTERNATIVE EMBODIMENT

DESELECTED

DESELECTED

SECTOR ERASE

DESELECTED

WORD/BIT ERASE

DESELECTED

PROGRAM

SELECTED

DESEL (same word)

READ BIASSING (WHOLE ARRAY)

DESELECTED WORD

DESELECTED WORD

TEST REQUIREMENTS:
(First alternative embodiment as in Fig.2)

BIT LINE SENSE

US 6,349,055 B1

NON-VOLATILE INVERTER LATCH

This application claims the benefit of U.S. Provisional Application No. 60/111,822, filed Dec. 11, 1998 and is hereby incorporated by reference in its entirety. This is a continuation of U.S. Ser. No. 09/456,801, filed Dec. 8, 1999 now U.S. Pat. No. 6,144,580.

FIELD OF THE INVENTION

The present invention relates to an inverter latch generally and, more particularly, to a two-transistor, zero DC power, non-volatile inverter latch that may be made using floating-gate or SONOS technology to provide a consistent and/or reliable logic high and/or logic low output level.

BACKGROUND OF THE INVENTION

An example of a conventional non-volatile inverter appears in U.S. Pat. No. 5,587,603 and is hereby incorporated by reference in its entirety. The '603 patent highlights the use of a single floating poly gate/layer to drive a P-channel transistor and an N-channel transistor of an inverter latch. The floating poly also needs a third terminal connected to provide an ERASE function.

In U.S. Pat. No. 4,829,203 (also incorporated by reference in its entirety), a single floating poly gate/structure controls both P-channel and N-channel devices of the inverter latch for an integrated programmable bit. The design appears to be complex, with the implementation of an additional diode and pullup transistor. U.S. Pat. No. 4,885,719 (also incorporated by reference in its entirety) is similar to the '203 and '603 schemes and has a shared floating gate.

None of the above-discussed schemes appears appropriate for SONOS (silicon-oxide-nitride-oxide-silicon) technology, since conducting floating gates appear to be required. Conventional technology does not appear to benefit from control of the supply busses (e.g., varying or changing supply voltages in a controlled manner).

SUMMARY OF THE INVENTION

The present invention concerns a non-volatile memory cell comprising a first transistor and a second transistor. The first transistor may be configured to receive an input and a first voltage. The second transistor may be configured to receive said input and a second voltage. The first and second transistors are generally coupled to an output.

The objects, features and advantages of the present invention include providing a nonvolatile inverter latch that may (i) be smaller and simpler than conventional latches; (ii) control independently both N-channel and P-channel transistor gates, (iii) be implemented in floating gate technology or SONOS technology; (iv) benefit from control of the supply busses; (v) improve the coupling ratio of transistors in the cell; (vi) reduce or eliminate parasitic capacitance(s) between floating gate and the substrate; (vii) eliminate isolated erase nodes and/or (viii) reduce erase voltages.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may control a floating poly gate common to the p-channel and n-channel transistors in a nonvolatile inverter and may provide a possible solution at very low voltage supplies and at sufficient Vt windows. Independent poly gates may be charged to match the physical and/or electrical properties of the individual transistors better than a shared floating poly gate. Equally, by implementing the same P-channel and N-channel transistors in a non-volatile inverter with SONOS (silicon oxide nitride oxide semiconductor) technology, the independent nitrides on each of the transistors may be charged to match the physical and/or electrical properties of the individual transistors better than a shared floating poly gate. The present invention may improve the coupling ratio of transistors in the cell, reduce or eliminate parasitic capacitance(s) between floating gates and the substrate, reduce the cell area as a result of eliminating isolated erase nodes, minimize program and/or erase voltages, etc.

The present invention concerns a non-volatile inverter latch which may be useful for programming PLDs, FPGAs or any type of programmable logic or programmable interconnect. The present. invention is also useful for, but not restricted to, micro-architectures of fine programming granularity. The present cell (EPROM-, EEPROM- or flash memory-based [preferably EEPROM-based] programming element) comprises two non-volatile devices, a P-channel variable threshold transistor and an N-channel variable threshold transistor, configured to form an inverter latch. A "variable threshold transistor" may refer to a transistor having a threshold voltage dependant on one or more electrical and/or physical properties of the transistor, such as voltage applied to the source, drain and/or control gate; tunnel oxide thickness; sensitivity to UV light exposure; number and/or chemical composition of dielectric materials adjacent to a gate (e.g., an oxide-nitride-oxide layered structure between the control gate and substrate, or a conventional control gate-intergate oxidepolysilicon floating gate-tunnel oxide-substrate layered structure), etc.

The output of the present inverter latch is a solid high (1) or a solid low (0) logic level, depending on the (programmed) state of the non-volatile devices. The output is available immediately on power-up from all such cells in an array at the same time, without any need for (stored state) recall sequencing or addressing or data sensing. Outside the array, there may be additional circuit blocks associated with high-voltage word address decoding, bit-line decoding and sensing, and high-voltage pump (programming voltage generation) and regulation, all outside the scope of this disclosure, which may be used for erasing, programming and reading (e.g., for test purposes) the present cell.

Figure 1:
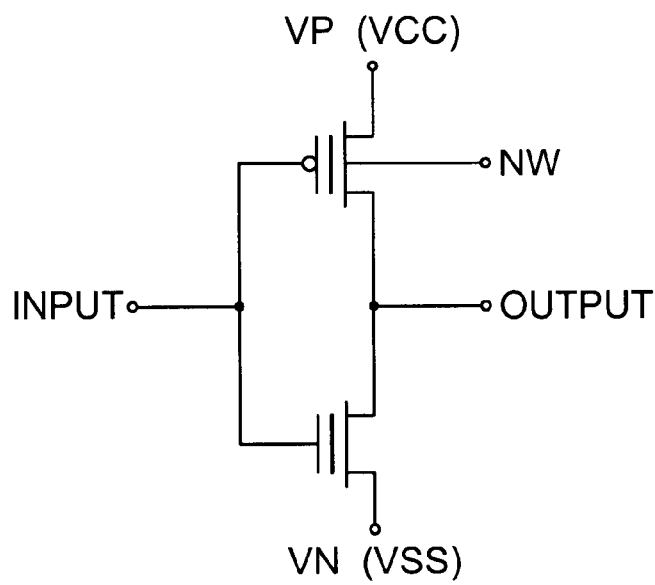
FIG. 1 illustrates a preferred embodiment of the present invention.
Figure 2:
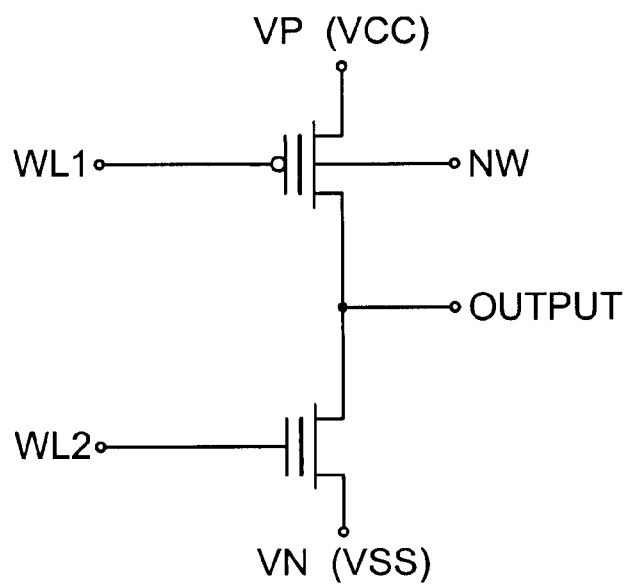
FIG. 2 illustrates an alternate embodiment of the present invention.

As shown in FIG. 1, the non-volatile P-MOS and N-MOS devices are connected in the style of a CMOS inverter. A second embodiment (see FIG. 2), however, has two independent gate controls, allowing the cell to become more flexible and less supply dependent albeit at the cost of extra control circuitry.

FIG. 1 shows the basic non-volatile cell, configured to "latch" or store the programmed data. The schematic in FIG. 1 will be used to describe the operation of the cell. The invention is described with reference to an N-Well twin-tub CMOS floating gate technology for making the cell, but is not limited to this technology. For example, SONOS technology is a possible alternative technology for making the cell and may be implemented in triple-well CMOS technology.

Figure 3:
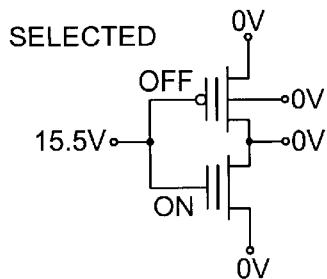
FIG. 3 illustrates exemplary conditions for an erase or a program which may be suitable for conventional floating poly gate technology.
Figure 3:
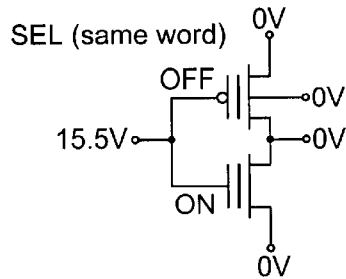
Figure 3:
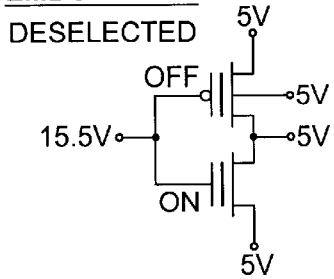
Figure 3:
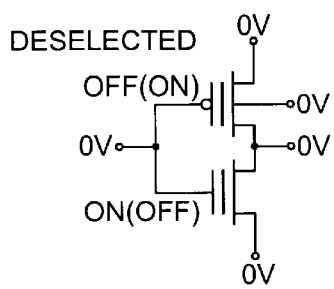
Figure 3:
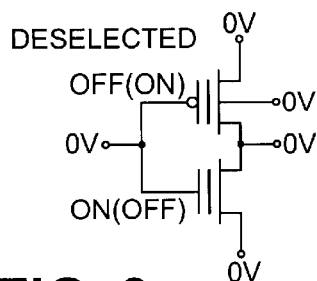
Figure 3:
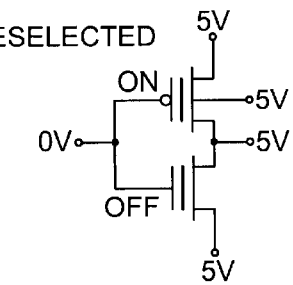
Figure 4:
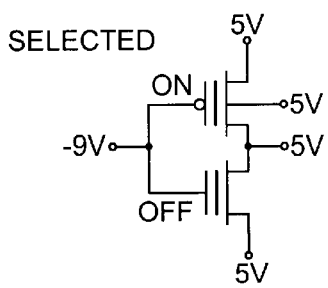
FIG. 4 illustrates exemplary conditions for a program or erase which may be suitable for conventional floating poly gate technology.
Figure 4:
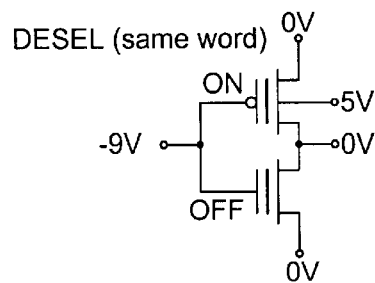
Figure 4:
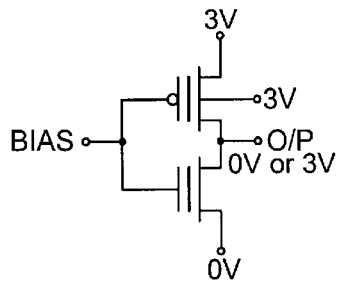
Figure 4:
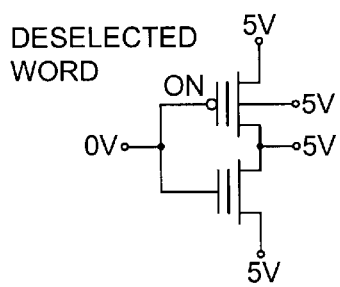
Figure 4:
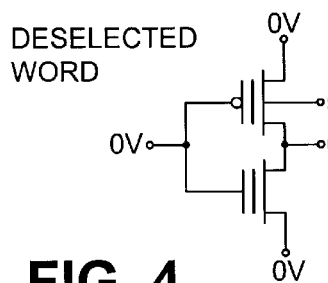
Figure 4:
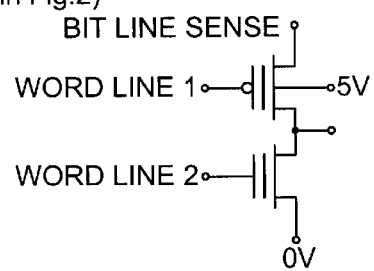

The diagrams in FIGS. 3 and 4 show the conditions necessary for the ERASE and PROGRAM routines in an array of cells made in floating gate technology, by way of example. Terminal Inputs, VP (e.g., a P-channel transistor reference/bias voltage), VN (e.g., an N- channel transistor reference/bias voltage), and the well connection NW (e.g., a well-biasing voltage; see FIG. 1) control the ERASE and/or PROGRAM functions. The "ON" and "OFF" labels for each transistor indicate the state of that transistor during the ERASE or PROGRAM routine. The state of a transistor in the cell, during one of these functions, is the opposite of that of the same transistor during a READ function.

The cells are shown in the left-hand and center columns of FIGS. 3 and 4 in a 2×2 matrix as they would appear as part of an array, the top row being selected for the "action", the bottom row being de-selected. Alternative embodiments are shown in the far right-hand column of FIG. 3 in which cells can be de-selected from erase by separate well bias and separate source and drain bias. The far right-hand column of FIG. 4 illustrates the read mode biasing, for a memory supply of 3v, and the first alternative embodiment is shown for facilitating a possible test mode. Not all transistors are labeled "ON" or "OFF" in the de-selected rows, as the state may depend on whether the previous action was an ERASE or a PROGRAM. In these cases sources and drains are at the same potential anyway. The READ or "application" mode is shown in the upper right diagram of FIG. 4, in which the input is set at a bias that allows the output to assume either a VCC or VSS level.

Elsewhere in FIGS. 3 and 4, "15.5v" refers to an exemplary positive (over)voltage for storing to a logic HIGH or "1" level or state, and/or for erasing a previously stored state (an "erase voltage"); "0v" refers to an exemplary ground or VSS voltage, or to an exemplary low logic state; "5v" may refer to either an exemplary positive operating voltage ("VCC") or to an exemplary (over)voltage for deselecting a cell (a "deselection voltage"); "3v" may refer to either an exemplary positive operating voltage ("VCC") or to an exemplary high logic state; and "–9v" refers to an exemplary negative (over)voltage for storing a logic LOW or "0" level or state, and/or for programming over a previously stored state (a "programming voltage").

Very high positive and/or negative voltages may appear only at the gates of the two devices, and may not appear at all at the sources and/or drains. This may not be essential (e.g., the exemplary voltage for storing may have substantially the same magnitude as the exemplary positive and/or negative operating voltage), such as in lower voltage programming of SONOS devices, but the arrangement may be particularly advantageous in a floating gate technology. No tunneling or breakdown will occur downstream of the output.

The cells are read by applying a bias voltage appropriate for outputting the stored state (e.g., a positive operating or bias voltage, such as 5 V, 3.3 V, 3 V, 2.5 V, 1.8 V, 1.5 V, 1.2 V, 1 V, etc.) to one or more, and preferably all, cells in the array. As in a CMOS inverter, in READ mode, one of the devices is always OFF, thus eliminating DC crowbar current. Where this is not the case (e.g., PROGRAM de-select, ERASE de-select), the source and drain potentials are the same, still effectively preventing current flow across the cell transistors.

The READ disturb is not as bad as, is often the case, for nonvolatile static random access memories (NVSRAM), as the gates are set to a mid-way bias. This read disturb becomes less as the supply voltage decreases.

The output is always at a reliable, consistent logic high or low during ERASE, PROGRAM, and READ, thus preventing contention or crowbar currents in the downstream circuitry. Thus, one may obtain reliable, predictable, relatively steady voltages from the present cell for use (e.g., as logic inputs in a conventional logic array).

In test mode, it may be useful to control the gates separately as shown under a first alternative embodiment in FIG. 4. Under these circumstances, the top supply line becomes the "bit line" for sensing the state of the non-volatile transistors, and the word lines are used in turn to switch one device fully "ON" (e.g., while sensing the state of the second) or turning the second device fully "ON" (e.g., while sensing the state of the first). The de-selected rows must have zero gate bias during this operation to guarantee that all transistors are OFF. This, by way of example, is not the only way to test the state of the non-volatile transistors in this inverter latch.

The second alternative embodiment in FIG. 3 allows for byte-wise (e.g., flash-type) or bit-wise ERASE, but at the cost of separate well connections and possible polysilicon field threshold difficulties. Note the well bias differences.

The present invention highlights a nonvolatile (e.g., EEPROM) latch for use, e.g., in configuration bit or program option setting, or in programmable logic. The invention is suitable for high packing density technologies that are, in turn, suitable for architectures of fine granularity.

The latch takes zero DC current during ERASE and PROGRAM functions, or when outputting high or low logic data (e.g., a "1" or "0") for an application (READ mode). The latch can be deployed freely, as described, within a digital circuit. The invention may also be suitable for use in an analog circuit. Non-volatile recall on power-up is bullet proof. In other words, it is guaranteed to work by design. The cell of the present invention is almost independent, electrically, of the circuitry or logic programmed by the cells, and is therefore nearly as easy to ERASE, PROGRAM, READ, and TEST as a standard EEPROM array.

An embodiment with independent gate controls may (i) lessen the potential problems of low poly field thresholds, (ii) provide more independent (tailored) control of non-volatile transistors during ERASE, PROGRAM and READ modes, and (iii) may facilitate TEST mode as described earlier (also see FIG. 4).

To keep read disturbs to a minimum, one may advantageously minimize voltage supply levels. Gate bias levels may also be selected to minimize this effect, particularly in the embodiment of the present invention having independent control gate inputs for each transistor in the cell (e.g., FIG. 2). In this embodiment the cell becomes much less supply-voltage dependent.

The sources (voltage supplies) of both P-channel and N-channel transistors should be controlled during ERASE, PROGRAM and TEST routines. Such control may be done in accordance with techniques known to those of ordinary skill in the art.

Further advantages of the present invention include a very compact non-volatile latch design, offering zero DC current, full rail output and reliable power-up recall of stored data. One may simply output the stored data directly into an input of a logic gate, or through a buffer or driver circuit (although one may also desirably store the data in a separate output latch or output register prior to externally outputting the data from an output buffer/driver), without having to first sense the data with a sense amplifier.

The present cell may benefit from modern (but conventional) thin tunnel oxide technology (e.g., copending application Ser. No. 08/878,728, filed Jun. 19, 1997, incorporated herein by reference in its entirety).

One of the complementary transistors in the present cell may be replaced with a second transistor of the same polarity (e.g., the cell could comprise two P-channel or two N-channel transistors). However, certain advantages of the complementary cell, such as zero DC current consumption, crowbar current prevention, etc., could be lost in a single-polarity alternative cell. In addition, the ability of both transistors in the complementary cell to be erased or programmed at the same time could also be lost.

Figure 5:
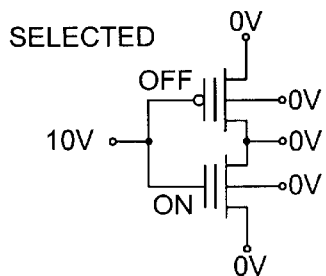
FIG. 5 illustrates exemplary conditions for an erase or a program which may be more suitable for triple-well SONOS technology.
Figure 5:
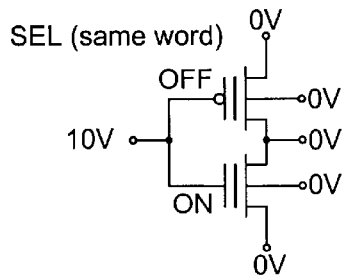
Figure 5:
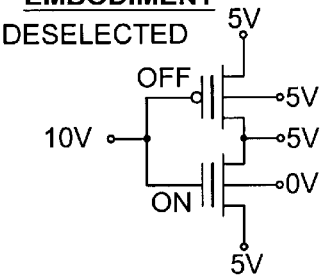
Figure 5:
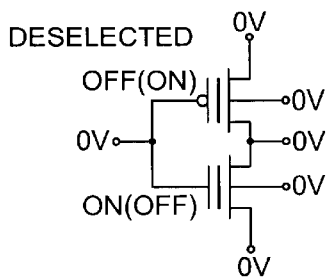
Figure 5:
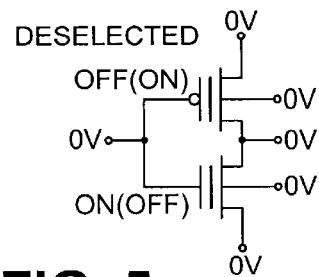
Figure 5:
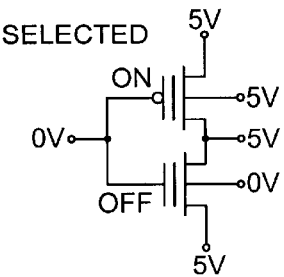
Figure 6:
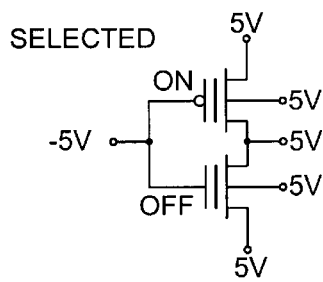
FIG. 6 illustrates exemplary conditions for a program or erase which may be more suitable for triple-well SONOS technology.
Figure 6:
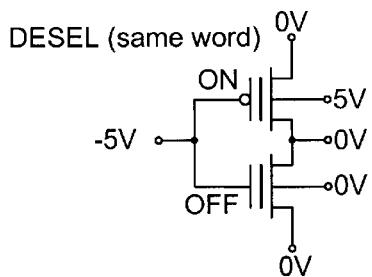
Figure 6:
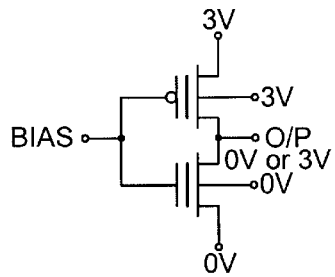
Figure 6:
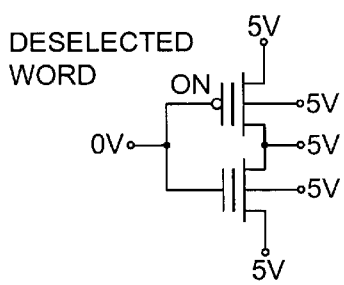
Figure 6:
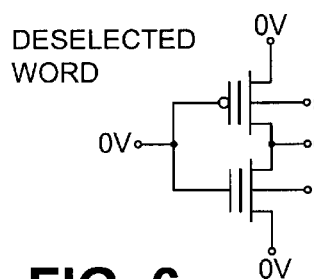
Figure 6:
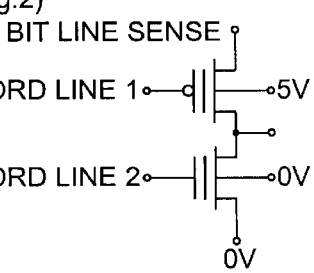

The diagrams in FIG. 5 and FIG. 6 show the extra well control required (e.g., in a third alternative embodiment) and the conditions necessary for the erase and program routines in an array of cells made in SONOS technology, by way of example. Lower over-voltages may be used in some cases, as illustrated.

The erase and program illustrations may be inter-changed in FIG. 3 and FIG. 4 for floating-gate as they can in FIG. 5 and FIG. 6 for SONOS, with care being taken over the voltage levels and polarities imposed on sources, drains and wells and care being taken over the connection of the PMOS and NMOS wells.

While the invention has been particularly shown and described with reference to the preferred embodiments thereof, it will be understood by those skilled in the art that various changes in form and details may be made without departing from the spirit and scope of the invention.

What is claimed is:

1. A non-volatile memory cell comprising a first variable threshold transistor configured to receive an input and a first voltage and a second variable threshold transistor configured to receive said input and a second voltage, wherein said first and second variable threshold transistors are coupled to an output and said input has a magnitude substantially equal to a magnitude of said first and/or said second voltage.

2. The non-volatile memory cell according to claim 1, comprising a non-volatile inverter latch.

3. The non-volatile memory cell according to claim 1, wherein said first and second variable threshold transistors are configured to eliminate DC crowbar current.

4. The non-volatile memory cell according to claim 1, wherein said first variable threshold transistor further includes a first control gate configured to receive said input and said second variable threshold transistor further includes a second control gate configured to receive said input.

5. The non-volatile memory cell according to claim 1, wherein said first variable threshold transistor further includes a first source-drain path coupled between said first voltage and said output and said second variable threshold transistor further includes a second source-drain path coupled between said second voltage and said output.

6. The non-volatile memory cell according to claim 1, wherein said first variable threshold transistor further includes a first well configured to receive a first well bias voltage and said second variable threshold transistor further includes a second well configured to receive a second well bias voltage.

7. The non-volatile memory cell according to claim 1, wherein said first variable threshold transistor comprises a non-volatile transistor of a first polarity and said second variable threshold transistor comprises a non-volatile transistor of a second polarity, complementary to said first polarity.

8. The non-volatile memory cell according to claim 7, wherein said first variable threshold transistor is configured to receive a high logic state voltage and said second variable threshold transistor is configured to receive a low logic state voltage.

9. The non-volatile memory cell according to claim 1, wherein said first and second variable threshold transistors each comprise a non-volatile transistor of a predetermined polarity.

10. The non-volatile memory cell according to claim 1, wherein each of said first and second variable threshold transistors comprise a SONOS transistor.

11. The non-volatile memory cell according to claim 1, wherein each of said first and second variable threshold transistors comprise a floating gate transistor.

12. The non-volatile memory cell according to claim 1, wherein said apparatus is configured to provide consistent logic high and logic low output levels of said output.

13. The non-volatile memory cell according to claim 1, wherein said first variable threshold transistor is configured to receive said input and said second variable threshold transistor is configured to receive a complement of said input.

14. The non-volatile memory cell according to claim 1, wherein said first and second variable threshold transistors are independently controlled.

15. The non-volatile memory cell according to claim 1, wherein said apparatus is configured to reduce parasitic capacitance between a gate and a substrate of each of said first and second variable threshold transistors.

16. The non-volatile memory cell according to claim 1, wherein said apparatus is configured to reduce an erase voltage and a programming voltage of each of said first and second variable threshold transistors.

17. The non-volatile memory cell according to claim 1, wherein said first and second variable threshold transistors are configured to have a threshold voltage dependent on one or more electrical properties and one or more physical properties of a particular transistor.

18. A non-volatile memory cell comprising:
means for applying a predetermined voltage to a first variable threshold transistor and a second variable threshold transistor; and
means for applying a first operating voltage to a source/drain terminal of a first one or more of said first and second variable threshold transistors and a second operating voltage to a source/drain terminal of a second one or more of said first and second variable threshold transistors, wherein said second operating voltage represents a voltage level complementary to said first operating voltage and said predetermined voltage has a magnitude substantially equal to a magnitude of said first and second operating voltages.

19. A method of storing a logic and/or data level and/or state in a non-volatile memory cell in an array, comprising the steps of:

(A) applying a predetermined voltage to a first variable threshold transistor and a second variable threshold transistor; and (B) applying a first operating voltage to a source/drain terminal of a first one or more of said first and second transistors and a second operating voltage to a source/drain terminal of a second one or more of said first and second transistors, wherein said second operating voltage represents a voltage level complementary to said first operating voltage and said predetermined voltage has a magnitude substantially equal to a magnitude of said first and second operating voltages.

* * * * *